United States Patent
Ku et al.

(10) Patent No.: US 8,418,853 B2
(45) Date of Patent: Apr. 16, 2013

(54) RETICLE POD WITH SENSOR

(75) Inventors: Chen-Wei Ku, Tucheng (TW); Shao Wei Lu, Tucheng (TW); Chin-Ming Lin, Tucheng (TW)

(73) Assignee: Gudeng Precision Industrial Co, Ltd, Taipei County (TW)

( * ) Notice: Subject to any disclaimer, the term of this patent is extended or adjusted under 35 U.S.C. 154(b) by 124 days.

(21) Appl. No.: 13/004,096

(22) Filed: Jan. 11, 2011

(65) Prior Publication Data
US 2012/0018347 A1 Jan. 26, 2012

(30) Foreign Application Priority Data
Jul. 21, 2010 (TW) .............................. 99123924 A

(51) Int. Cl.
*B65D 85/00* (2006.01)
(52) U.S. Cl.
USPC ........................... 206/710; 206/454; 206/724

(58) Field of Classification Search ................. 206/832, 206/454, 455, 710; 118/666, 500; 211/41.1
See application file for complete search history.

(56) References Cited

U.S. PATENT DOCUMENTS

| | | | |
|---|---|---|---|
| 7,450,219 B2 * | 11/2008 | Matsutori et al. | 355/75 |
| 7,469,788 B2 * | 12/2008 | Chiu et al. | 206/710 |
| 7,528,936 B2 * | 5/2009 | Gregerson et al. | 355/72 |
| 2005/0200829 A1 * | 9/2005 | Chiu | 355/75 |
| 2006/0076264 A1 * | 4/2006 | CletusWittman | 206/710 |
| 2008/0128303 A1 * | 6/2008 | Phillips et al. | 206/316.1 |
| 2009/0027639 A1 * | 1/2009 | Phillips et al. | 355/30 |
| 2009/0297303 A1 * | 12/2009 | Hyobu et al. | 414/269 |
| 2010/0051501 A1 * | 3/2010 | Corbin et al. | 206/710 |

* cited by examiner

*Primary Examiner* — Luan K Bui
*Assistant Examiner* — Rafael Ortiz
(74) *Attorney, Agent, or Firm* — Ming Chow; Sinorica, LLC

(57) ABSTRACT

An EUV pod with pressure sensors disposed between its inner container and outer container, wherein pressure sensors disposed on the inner side of the outer container are used to detect the pressure between the outer container and the inner container, and the pressure data are used to determine whether the inner container is firmly fastened by the outer container.

17 Claims, 3 Drawing Sheets

RETICLE POD WITH SENSOR

BACKGROUND OF THE INVENTION

1. Field of the Invention

The present invention is related to a container for storing semiconductor components or reticles, and more particularly, to a reticle pod, in which sensing apparatuses (especially pressure sensors) are disposed to determine whether the reticle pod is stably fastened.

2. Description of the Prior Art

In the rapidly developing modern semiconductor technology, optical lithography tool plays an important role. The pattern definition relies fully on optical lithography technology. In the application of optical lithography tool related to semiconductors, pre-designed circuit paths are fabricated as light-transparent reticle in specific form. Basing on the principle of exposure, after light from the light source passes through the reticle and is projected on a silicon wafer, specific circuit pattern can be exposed on the silicon wafer.

The industry trend is toward smaller chip dimensions and/or production of higher density logic chips at smaller linewidth on larger wafers. Apparently, both the degree of how precisely a reticle can be projected with the pattern and the degree of how exactly the pattern can be reproduced on the surface of a wafer affect the quality of a final semiconductor product. The resolution with which the pattern is reproduced on a wafer is determined by the wavelength of UV light used to project on the surface of wafer covered with photoresist. DUV (deep ultraviolet light) with the wavelength of 193 nm is used in current lithography tool, the minimum feature size compatible with which is 100 nm. At present lithography tool using EUV (extreme ultraviolet light) with the wavelength of 157 nm has been developed so that the resolution of feature size can be smaller than 70 nm.

Thus it is very important to prevent the surface of the reticle from being contaminated by any contaminant, since the contaminant can cause damage to the surface or distortion of pattern projected onto the photoresist layer in the process and thus result in final product of poor quality. Above the surface of a conventional reticle is a thin, transparent pellicle that stretches over a frame, and the functions of the pellicle are to seal off the reticle from external contaminants and to reduce printing defects that may be caused by contaminants moving to the pattern template. However, whereas reflection on the patternized surface is used in EUV lithography, transmission is used in DUV lithography. At present, the conventional art is still not able to provide pellicle material that can be penetrated by EUV. Therefore, it is easier for reflection reticles in EUV lithography to be contaminated and damaged to a higher degree than reticles in conventional lithography. From this situation thus arise the requirement for containers to be used in EUV lithography for receiving, storing, transporting, and carrying wafer with reinforced functions.

Consequently, in order to reduce contamination generated during the process of storing, manufacturing, and transporting, the isolation technology of the prior art that has been developed employs a reticle pod, in which an inner container is used for carrying the reticle and an outer container for fastening the inner container therein, referring to FIG. 6. As shown in FIG. 6, the lower cover c and the upper cover d of an inner container cover the reticle e and fasten the reticle e within the inner container, and then the lower cover a and the upper cover b of an outer container cover the inner container and fasten the inner container within the outer container. During the exposure process of EUV lithography, in the lithography tool, the inner container needs to be first taken out of the outer container and then the reticle is taken out of the inner container for the exposure to be performed. Thus, when the exposure process is performed, it is necessary for the inner container and the outer container to be separated from each other or to be joined together; however, during the exposure process, the operating staff is not able to know whether the inner container still remains in the non-transparent outer container or whether the inner container has really been tightly covered. Under such circumstance of uncertainty, it is highly possible for the inner container to fall or get lost, which then results in damage of reticle and thus increase of cost. In consideration of this, the present invention provides a reticle pod in which pressure between the outer container and the inner container can be detected.

SUMMARY OF THE INVENTION

According to what is described above, one primary objective of the present invention is to provide a reticle pod in which pressure sensors are disposed between the outer container and the inner container, wherein the pressure sensors disposed between the outer container and the inner container are used to detect pressure and light signals electrically connected to the pressure sensors are used to determine whether the inner container is fastened by the outer container.

Another primary objective of the present invention is to provide a reticle pod in which pressure sensors are disposed between the outer container and the inner container, wherein the pressure sensors disposed between the outer container and the inner container are used to stably fasten the inner container within the outer container to prevent damages to the reticle caused by vacillation or collision from occurring.

Still another primary objective of the present invention is to provide a reticle pod in which pressure sensors are disposed between the outer container and the inner container, wherein the thermo-hygrometer disposed between the outer container and the inner container are used to measure the environmental conditions of the interior of the reticle pod to prevent from excessively high or low temperature or humidity that will cause damage to the reticle in the interior.

According to the aforementioned objectives, the present invention first provides a reticle pod in which pressure sensors and thermo-hygrometer are disposed. The reticle pod comprises a lower cover having a first inner surface and an upper cover having a second inner surface, a first inner space being formed by the first inner surface and the second inner surface when the lower cover and the upper cover are joined together; a lower subcover having a first inner subsurface and an upper subcover having a second inner subsurface are disposed in the first inner space, a second inner space being formed by the first inner subsurface and the second inner subsurface; a plurality of pressure sensors are penetratively disposed through the outer surface of the upper cover to a plurality of through holes of the second inner surface, the sensor end of pressure sensors being located between the second inner surface and the outer subsurface of the upper subcover.

The present invention then provides a reticle pod in which pressure sensors and thermo-hygrometer are disposed. The reticle pod comprises a lower cover having a first inner surface and an upper cover having a second inner surface, a first inner space being formed by the first inner surface and the second inner surface when the lower cover and the upper cover are joined together; a lower subcover having a first inner subsurface and an upper subcover having a second inner subsurface are disposed in the first inner space, a second inner space being formed by the first inner subsurface and the second inner subsurface; a recess is formed on the outer surface of the upper cover; a plurality of pressure sensors are penetratively disposed through the recess of the outer surface of the upper cover to a plurality of through holes of the second inner surface opposite to another side, the sensor end of pressure sensors being located between the second inner surface and the outer subsurface of the upper subcover.

The present invention further provides a reticle pod in which pressure sensors and thermo-hygrometer are disposed. The reticle pod comprises a lower cover having a first inner surface and an upper cover having a second inner surface, a first inner space being formed by the first inner surface and the second inner surface when the lower cover and the upper cover are joined together; a lower subcover having a first inner subsurface and an upper subcover having a second inner subsurface are disposed in the first inner space, a second inner space being formed by the first inner subsurface and the second inner subsurface; a plurality of pressure sensors are penetratively disposed through the outer surface of the upper cover to a plurality of through holes of the second inner surface, the sensor end of pressure sensors being located between the second inner surface and the outer subsurface of the upper subcover; a thermo-hygrometer is disposed on the second inner surface of the upper cover; a data indicator is disposed on the outer surface and electrically connected to the pressure sensors and the thermo-hygrometer.

Using the design provided by the present invention, the pressure sensed can be detected to determine whether the upper and lower covers of the outer container are securely fastened so that unnecessary damages that may occur during the transporting or storing process can be avoided.

DESCRIPTION OF THE PREFERRED EMBODIMENT

The present invention discloses a reticle pod in which sensors, pressure sensors in particular, are disposed between the outer container and the inner container; reticle, pod, supporter in the reticle pod, or sensors are accomplished by using currently available technologies and detailed description of these components is thus omitted in the following. In addition, drawings referred to in the following description are not completely drawn according to the actual scale and only serve the function of illustrating characteristics related to the present invention.

Figure 1:
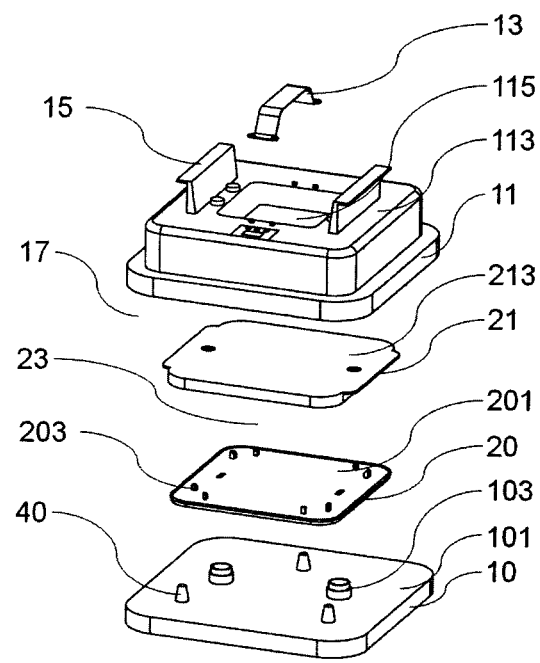
FIG. 1 is an explosive view of the present invention.

First, referring to FIG. 1, which is an explosive view of the reticle pod of the present invention. As shown in FIG. 1, the reticle pod comprises a lower cover 10 and an upper cover 11, wherein the lower cover 10 includes a first inner surface 101 on which at least a plurality of fasteners 40 are formed, three protruding fasteners 40 being formed on the first inner surface 101 in a preferred embodiment; the upper cover 11 includes a second inner surface 111 and an outer surface 113 opposite to another side of the second inner surface, and when the lower cover 10 and the upper cover 11 are joined together, a first inner space 17 is formed between the first inner surface 101 of the lower cover 10 and the second inner surface 111 of the upper cover 11, an outer container being thus formed; a lower subcover 20 includes a first inner subsurface 201, at least a plurality of protruding supporters 203 being formed at four corners of the first inner subsurface 201; an upper subcover 21 includes a second inner subsurface 211 and an outer subsurface 213 opposite to another side of the second inner surface, and since the lower subcover 20 and the upper subcover 21 are both disposed in the first inner space 17, thus when the lower subcover 20 and the upper subcover 21 are joined together, a second inner space 23 is formed between the first inner subsurface 201 of the lower subcover 20 and the second inner subsurface 211 of the upper subcover 21, an inner container thus being formed; a recess 115 is formed on the outer surface 113 of the upper cover 11; a handle 13 is disposed on the outer surface 113 of the upper cover 11 and stretches over the recess 115, wherein a distance is kept between the handle 13 and the recess 115 to form a handle space of handle 13 into which a carrier can conveniently reach his/her hand; a pair of flanges 15 are disposed on the outer surface 113 of the upper cover 11 to facilitate the picking up of the reticle pod either performed by a robot or by operating staff, and the shape of the flanges is not limited in the present invention, the pair of flanges 15 being bilaterally symmetric right-angle folded plates that facilitate the picking up performed by a robot in a preferred embodiment.

Furthermore, at least a valve 103 is disposed in the lower cover 10, the valve 103 being a columnar member that penetrates from the bottom of the lower cover 10 to the first inner surface 101 opposite to the bottom and this columnar valve 103 further extending upward to the lower subcover 20 and penetrating the lower subcover 20 to the first inner subsurface 201. The major function of the valve 103 is to purge the second inner space 23 with inert gas to clean and protect the reticle 50 in the inner container. In a preferred embodiment of the present invention, two valves 103 are disposed in the lower cover 10, wherein one valve 103 is a purge valve and the other valve 103 is an exhausting valve, and the locations of two valves 103 in the lower cover 10 and the locations of the purge/exhausting platforms (not shown in Figure) are the same; however, the number of valve 103, the location(s) of the valve 103 in the lower cover 10, and the purge/exhausting function of the valve 103 are not limited in the present invention.

Figure 2:
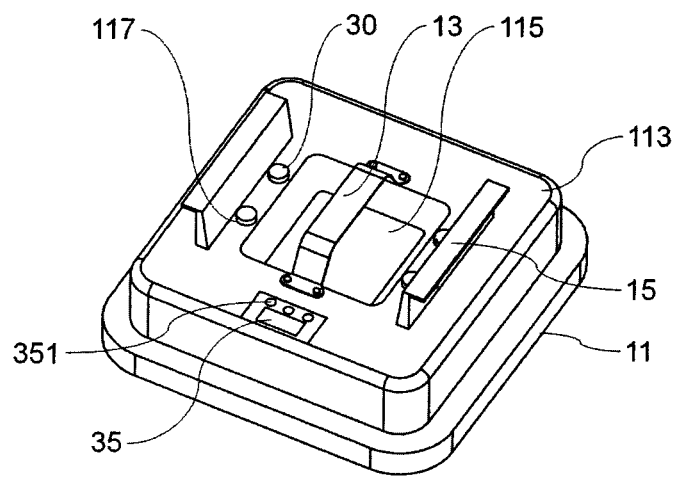
FIG. 2 is a view of the upper cover of the present invention.

Then, referring to FIG. 2, which is a view of the upper cover of the present invention. As shown in FIG. 2, a plurality of through holes 117 are disposed around the recess 115 on the outer surface 113 of the upper cover 11; a pressure sensor 30 is respectively disposed in each of the through holes 117, and the pressure sensor 30 is an apparatus that can make up-and-down movement, such as a lock-fastening apparatus with rotating function or a lock-fastening apparatus that can be screw driven to make up-and-down movement. What is to be emphasized is that, in the present invention, it is not limited that the through holes 117 can only be disposed around the recess 115; the through holes 117 can also be disposed on the recess 115, which is not limited in the present invention. Moreover, a plurality of pressure sensors 30 are electrically connected to a data indicator 35 disposed on the outer surface 113 of the upper cover 11 to display pressure value detected by the pressure sensors 30. Meantime, at least an indicator light 351 is also further disposed on the data indicator 35 to flash light signals of different colors according to the pressure values detected by the pressure sensors 30.

Figure 3:
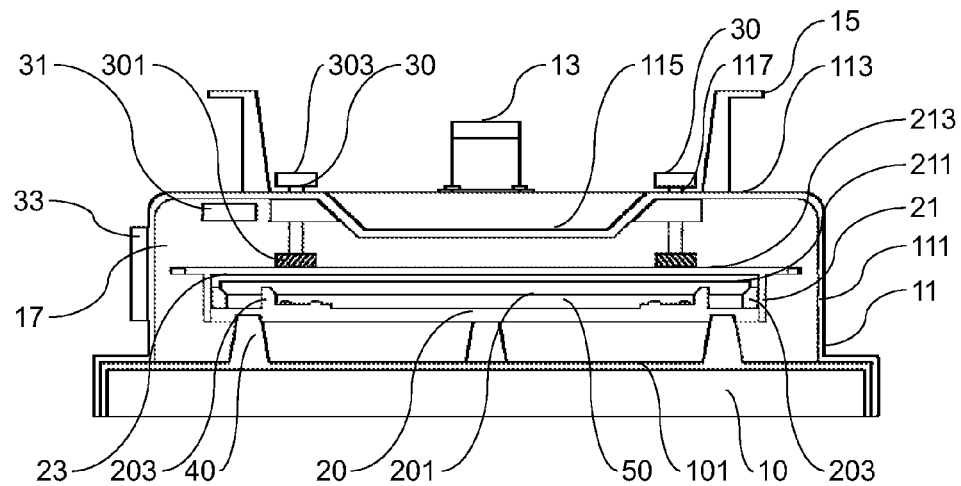
FIG. 3 is a sectional view of the present invention in which a reticle is carried.

Then, referring to FIG. 3, which is a sectional view of the reticle pod of the present invention that carries a reticle. As shown in FIG. 3, a reticle 50 is placed and fastened in the second inner space 23 formed by the first inner subsurface 201 of the lower subcover 20 and the second inner subsurface 211 of the upper subcover 21, wherein a plurality of protruding supporters 203 are disposed near the four corners of the first inner subsurface 201 of the lower subcover 20 for confining the reticle 50 among the plurality of protruding supporters 203; a plurality of fasteners 40 are disposed on the first inner surface 101 of the lower cover 10, and a first inner space 17 is formed when the upper cover 11 and the lower cover 10 are joined together, the joined lower subcover 20 and upper subcover 21 being placed and fastened in the first inner space 17; meanwhile, the lower subcover 20 is supported by the fasteners 40 on the first inner surface 101 of the lower cover 10. Furthermore, a plurality of pressure sensors 30 are disposed in corresponding through holes 117. One adjustment end 303 of each pressure sensor 30 is disposed on the outer surface 113 of the upper cover 11, and the sensor end 301 of each pressure sensor 30 is disposed on the second inner surface 111 of the upper cover 11 to be located between the second inner surface 111 and the outer subsurface 213; and therefore, the adjustment end 303 of the pressure sensor 30 can be used to adjust the sensor end 301 for the sensor end 301 to contact the outer subsurface 213 of the upper subcover 21 and for the pressure sensor 30 to be disposed between the outer container and the inner container of the reticle pod. Apparently, after the lower cover 10 and the upper cover 11 are joined, since the sensor ends 301 are adjusted to press and contact the outer subsurface 213 of the upper subcover 21, the lower subcover 20 will be fastened with the support of the fasteners 40 on the first inner surface 101 of the lower cover 10. Thus, the sensor ends 301 of the pressure sensors 30 will be pressing onto the outer subsurface 213 of the upper subcover 21 and a fixed pressure is maintained, the values of the fixed pressure being indicated by the data indicator 35. Therefore, the pressure values indicated by the data indicator 35 can be used to determine whether the upper subcover 21 and the lower subcover 20 are precisely fastened within after the upper cover 11 and the lower cover 10 are joined together; if the pressure values indicated attain the default pressure values, the indicator light 351 on the data indicator 35 will flash a light signal, such as a green light signal. The light signal indicates that the reticle pod is ready to be transported at the time; when a robot is needed to perform the transportation of the reticle pod, the flanges 15 on the upper cover 11 of the reticle pod can facilitate the transportation; when an operating staff is needed to perform the transportation of the reticle pod, the handle 13 on the upper cover 11 of the reticle pod can be used by the operating staff and facilitate the transportation since a recess 115 is formed below the handle 13 of the reticle pod for the operating staff to reach his/her hand into the recess 115 and grip the handle 13. Since the upper subcover 21 and the lower subcover 20 are precisely fastened in the first inner space 17, safety of the reticle 50 located in the second inner space 23 formed by the upper subcover 21 and the lower subcover 20 can thus be further secured in the process of transporting or carrying the reticle pod. For another example, if any of the pressure values detected by the plurality of pressure sensors 30 does not attain the default pressure values, the indicator light 351 on the data indicator 35 will flash another light signal, such as a red light signal, which indicates that the upper cover 11 is not precisely joined with the lower cover 10 so that the pressure values detected by the plurality of pressure sensors 30 are different from one another. For yet another example, after the upper subcover 21 and the lower subcover 20 are taken out between the upper cover 11 and the lower cover 10, when the upper cover 11 and the lower cover 10 are joined together, the sensor ends 301 of the pressure sensors 30 will not press onto the outer subsurface 213 of the upper subcover 21 since the upper subcover 21 and the lower subcover 20 are no longer in the first inner space 17 formed by the upper cover 11 and the lower cover 10 and thus no pressure will be detected by the pressure sensors 30; the indicator light 351 on the data indicator 35 will at the time flash another different light signal, such as a yellow light signal, which indicates that there is no reticle between the upper cover 11 and the lower cover 10.

As described above, when the upper cover 11 and the lower cover 10 of the reticle pod of the present invention are joined together, the user can easily determine whether there is a reticle in the first inner space 17 between the upper cover 11 and the lower cover 10 and whether the upper subcover 21 and the lower subcover 20 that confine the reticle are securely fastened in the first inner space 17 according to the light signal flashed on the data indicator 35.

Then, a thermo-hygrometer 31 can be further disposed on the second inner surface 111 of the upper cover 11 in the present invention, the thermo-hygrometer 31 being used mainly for measuring the temperature and humidity in the first inner space 17 and being electrically connected to the data indicator on the outer surface 113 so that the data indicator 35 can display the degrees of temperature and humidity for determining whether there are changes in temperature and humidity in the first inner space 17. In addition, in the embodiments of the present invention, the pressure sensors 30 and the thermo-hygrometer 31 can be further equipped with wireless transfer function. The pressure sensors 30 and the thermo-hygrometer 31 are electrically connected to the transmitter 33, and the values of pressure detected by pressure sensors 30 and the temperature and humidity degree data measured by the thermo-hygrometer 31 are transmitted to master (not shown) to facilitate the procedure of monitoring; the wireless transfer function is achieved by currently available technologies and the description of which is thus omitted.

What is to be emphasized is that, the sensors disposed in the present embodiment are not limited to be pressure sensors 30 but can also be other types of sensors. In a preferred embodiment, an object sensor (not shown in Figure) can be disposed for detecting whether the inner container is still in the outer container and for sending a signal to trigger other pressure sensors 30 to sense and detect the pressure received by the inner container in order to determine whether the inner container is properly placed. Thus, the type and number of sensors and the method for transmitting signals among sensors are not limited in the present invention.

Figure 4:
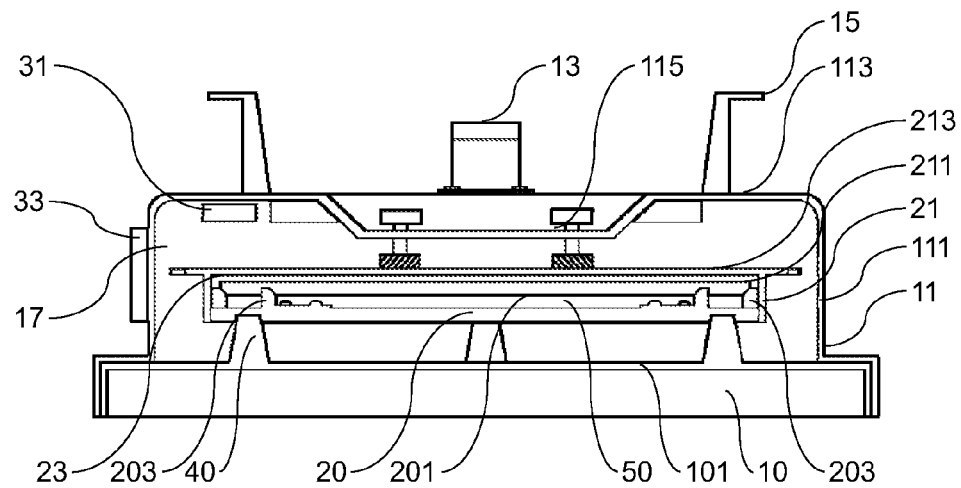
FIG. 4 is a view of the disposition of the pressure sensors of another embodiment of the present invention.

Referring then to FIG. 4, which is a view of the disposition of pressure sensors of another embodiment of the present invention. The difference between FIG. 4 and FIG. 3 is in that the plurality of through holes 117 on the upper cover 11 are disposed in the recess 115 of the outer surface 113 of the upper cover 11, and the plurality of pressure sensors 30 are disposed in the plurality of through holes 117; one adjustment end 303 of each pressure sensor 30 is disposed on the outer surface 113 of the recess 115 of the upper cover 11, and the sensor end 301 of each pressure sensor 30 is disposed on the second inner surface 111 of the recess 115 of the upper cover 11, and thus the sensor end 301 is between the second inner surface 111 and the outer subsurface 213 of the recess 115 and can be adjusted by the adjustment end 303 of each pressure sensor 30 to be in contact with the outer subsurface 213 of the upper subcover 21 for each pressure sensor 30 to be disposed between the outer container and the inner container of the reticle pod; when the upper cover 11 and lower cover 10 are joined together, the pressure sensors 30 and the fasteners 40 on the first inner surface 101 of the lower cover 10 fasten the inner container (i.e. the outer subsurface 213 of the upper subcover 21), and the pressure sensors 30 remaining at fixed status will continue to detect and output a pressure value. Apparently, when being compared with the embodiment shown in FIG. 3, the present embodiment differs in that a plurality of pressure sensors 30 are disposed in the recess 115; the function of the reticle pod of the present embodiment is the same as the function of the reticle pod of the embodiment shown in FIG. 3 and is thus omitted.

Figure 5:
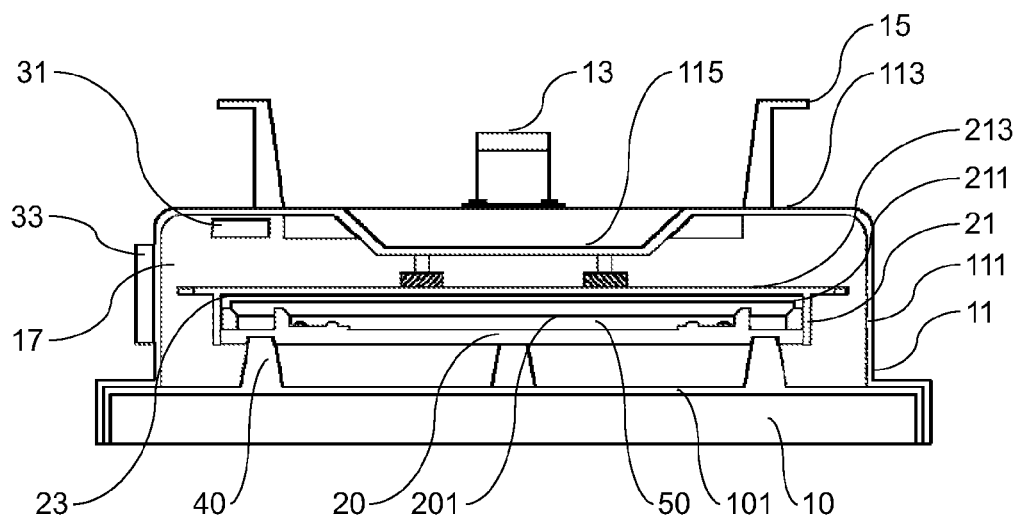
FIG. 5 is a view of the disposition of the pressure sensors of still another embodiment of the present invention.
Figure 6:
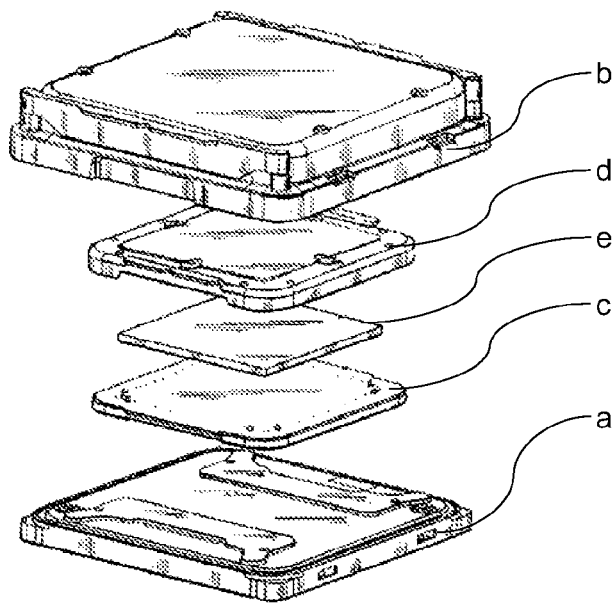
FIG. 6 is a view of a reticle storing container of the prior art.

Then, referring to FIG. 5, which is a view of the disposition of pressure sensors of still another embodiment of the present invention. The plurality of pressure sensors 30 are directly disposed on the second inner surface 111 of the recess 115 of the upper cover 11 for the sensor ends 301 of pressure sensors 30 to be located between the second inner surface 111 and the outer subsurface 213 of the upper subcover 21; in the present embodiment, the pressure sensors 30 are in a fixed, unadjustable status, and thus the length of the pressure sensors 30 equals to the distance between the second inner surface 111 of the upper cover 11 and the outer subsurface 213 of the upper subcover 21 when the outer container is joined together. The sensor ends 301 of the pressure sensors 30 are in contact with the outer subsurface 213 of the upper subcover 21, and when the upper cover 11 and the lower cover 10 are joined together, the inner container is fastened by the pressure sensors 30 and the fasteners 40 on the first inner surface 111 of the lower cover 10, and the pressure sensors 30 remaining at fixed status will continue to detect and output a pressure value. Apparently, when being compared with the embodiment shown in FIG. 3, the present embodiment differs in that a plurality of pressure sensors 30 are disposed in the recess 115; the function of the reticle pod of the present embodiment is the same as the function of the reticle pod of the embodiment shown in FIG. 3 and is thus omitted.

Although the present invention has been described with reference to the aforementioned preferred embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A reticle pod disposed with sensing apparatus, comprising:
a lower cover, having a first inner surface, a plurality of fasteners being formed on said first inner surface;
an upper cover, having a second inner surface and an outer surface opposite to another side of said second inner surface and being disposed with at least a through hole that penetrates said outer surface and said second inner surface, a first inner space being formed by said first inner surface and said second inner surface when said lower cover and said upper cover are joined together;
a lower subcover, located in said first inner space and contacting said plurality of fasteners, said lower subcover having a first inner subsurface;
an upper subcover, located in said first inner space and having a second inner subsurface and an outer subsurface opposite to another side of said second inner subsurface, a second inner space being formed by said first inner subsurface and said second inner subsurface when said lower subcover and said upper subcover are joined together; and
at least a sensor, disposed in said through hole, each of said sensor having a sensor end and said sensor end being located on said second inner surface of said upper cover, the sensor sensing and detecting a condition between said first inner space and said second inner space a thermo-hygrometer being disposed in said first inner space.

2. The reticle pod according to claim 1, wherein said sensor is a pressure sensor, the sensor end of said pressure sensor pressing onto the outer subsurface of the upper subcover for sensing and detecting a pressure received by said upper subcover and said lower subcover.

3. The reticle pod according to claim 2, further comprising a data indicator, said data indicator being disposed on the outer surface of the upper cover and electrically connected to said pressure sensor to display the pressure value detected by the pressure sensor.

4. The reticle pod according to claim 1, further comprising a data indicator, said data indicator being disposed on the outer surface of the upper cover and electrically connected to said thermo-hygrometer to display degrees of temperature detected by the thermo-hygrometer.

5. The reticle pod according to claim 1, wherein said sensor further comprises an adjustment end.

6. The reticle pod according to claim 1, wherein a recess is further disposed on said upper cover.

7. The reticle pod according to claim 1, wherein at least a handle is further disposed on said upper cover.

8. The reticle pod according to claim 1, further comprising a pair of flanges which are located on said outer surface of said upper cover.

9. The reticle pod according to claim 1, further comprising a transmitter which is electrically connected to said sensor, said transmitter being equipped with wireless transfer function.

10. The reticle pod according to claim 1, wherein at least a valve is further disposed on said lower cover, said valve being a columnar member penetrating from bottom of said lower cover to said first inner surface opposite to said bottom and further extending upward to said lower subcover and penetrating said lower subcover to said first inner subsurface.

11. A reticle pod disposed with sensing apparatus, comprising:
a lower cover, having a first inner surface, a plurality of fasteners being formed on said first inner surface;
an upper cover, having a second inner surface and an outer surface opposite to another side of said second inner surface, a recess being formed on said outer surface of said upper cover in the direction of said first inner surface of said lower cover, at least a through hole that penetrates said outer surface and said second inner surface being disposed on said recess, a first inner space being formed by said first inner surface and said second inner surface when said lower cover and said upper cover are joined together;
a lower subcover, located in said first inner space and contacting said plurality of fasteners, said lower subcover having a first inner subsurface;
an upper subcover, located in said first inner space and having a second inner subsurface and an outer subsurface opposite to another side of said second inner subsurface, a second inner space being formed by said first inner subsurface and said second inner subsurface when said lower subcover and said upper subcover are joined together; and
at least a sensor, disposed in said through hole of said recess of said upper cover, each of said sensor having a sensor end and said sensor end being located on said second inner surface of said upper cover, the sensor sensing and detecting a condition between said first inner space and said second inner space a thermo-hygrometer being disposed in said first inner space.

12. The reticle pod according to claim 11, wherein said sensor is a pressure sensor, the sensor end of said pressure sensor pressing onto the outer subsurface of the upper subcover for sensing and detecting a pressure received by said upper subcover and said lower subcover.

13. The reticle pod according to claim 11, wherein said sensor further comprises an adjustment end.

14. The reticle pod according to claim 11, wherein a recess is further disposed on said upper cover.

15. The reticle pod according to claim 11, wherein at least a handle is further disposed on said upper cover.

16. A reticle pod disposed with sensing apparatus, comprising:
- a lower cover, having a first inner surface, a plurality of fasteners being formed on said first inner surface;
- an upper cover, having a second inner surface and an outer surface opposite to another side of said second inner surface, a recess being formed on said outer surface of said upper cover in the direction of said first inner surface of said lower cover, a first inner space being formed by said first inner surface and said second inner surface when said lower cover and said upper cover are joined together;
- a lower subcover, located in said first inner space and contacting said plurality of fasteners, said lower subcover having a first inner subsurface;
- an upper subcover, located in said first inner space and having a second inner subsurface and an outer subsurface opposite to another side of said second inner subsurface, a second inner space being formed by said first inner subsurface and said second inner subsurface when said lower subcover and said upper subcover are joined together; and
- at least a sensor, disposed on said second inner surface of said recess of said upper cover, the sensor sensing and detecting a condition between said first inner space and said second inner space a thermo-hygrometer being disposed in said first inner space.

17. The reticle pod according to claim 16, wherein said sensor is a pressure sensor, the pressure sensor including a sensor end pressing onto the outer subsurface of the upper subcover for sensing and detecting a pressure received by said upper subcover and said lower subcover.

* * * * *